(12) United States Patent
Choi

(10) Patent No.: US 7,615,450 B2
(45) Date of Patent: Nov. 10, 2009

(54) METHOD OF MANUFACTURING FLASH MEMORY DEVICE

(75) Inventor: Eun Seok Choi, Seongnam-si (KR)

(73) Assignee: Hynix Semiconductor Inc., Icheon-shi (KR)

( * ) Notice: Subject to any disclaimer, the term of this patent is extended or adjusted under 35 U.S.C. 154(b) by 136 days.

(21) Appl. No.: 11/860,894

(22) Filed: Sep. 25, 2007

(65) Prior Publication Data
US 2008/0081417 A1    Apr. 3, 2008

(30) Foreign Application Priority Data
Sep. 29, 2006    (KR) .................. 10-2006-0096103

(51) Int. Cl.
*H01L 21/336* (2006.01)
(52) U.S. Cl. .................. 438/261; 257/E21.422; 438/270
(58) Field of Classification Search .................. 438/257, 438/259, 260–261, 264, 287; 257/315, 324, 257/325, E21.422
See application file for complete search history.

(56) References Cited

U.S. PATENT DOCUMENTS

| 6,468,862 | B1 | 10/2002 | Tseng | 438/259 |
| 6,914,013 | B2 * | 7/2005 | Chung | 438/770 |
| 6,987,047 | B2 * | 1/2006 | Iguchi et al. | 438/257 |
| 7,084,031 | B2 * | 8/2006 | Lee | 438/257 |

FOREIGN PATENT DOCUMENTS

| JP | 2004-153049 | 5/2004 |
| KR | 10-2005-0070529 | 7/2005 |

* cited by examiner

*Primary Examiner*—W. David Coleman
*Assistant Examiner*—Daniel Shook
(74) *Attorney, Agent, or Firm*—Marshall, Gerstein & Borun LLP

(57) ABSTRACT

Disclosed herein is a method of fabricating a flash memory device. The method includes providing a semiconductor substrate that includes an active region and a field region. A tunnel insulating layer and a first conductive layer are formed in the active region, and an isolation structure is formed in the field region. The method includes forming a dielectric layer along a surface of the first conductive layer and the isolation structure, forming a capping layer along a surface of the dielectric layer, and forming a hard mask layer over the capping layer. The method also includes performing a first etchant process to etch the capping layer and the dielectric layer over the isolation structure forming holes. The method further includes performing a second etch process to remove the hard mask layer to form an undercut in the dielectric layer. Still further, the method includes forming a second conductive layer over a structure in which the holes and the undercut are formed.

17 Claims, 3 Drawing Sheets

METHOD OF MANUFACTURING FLASH MEMORY DEVICE

CROSS-REFERENCE TO RELATED APPLICATION

The present application claims priority to Korean patent application number 2006-96103, filed on Sep. 29, 2006, which is incorporated by reference in its entirety.

BACKGROUND OF THE INVENTION

1. Field of the Invention

The present invention relates to a method of fabricating a flash memory device and, more particularly, to a method of fabricating a flash memory device that can reduce incidences of an inter-bit line interference phenomenon by minimizing a phenomenon in which charges are trapped at a dielectric layer over an isolation structure.

2. Brief Description of Related Technologies

A "data storage" operation of a flash memory device is generally performed based on the principle that charges are stored in a floating gate according to a voltage applied to a control gate. A tunnel insulating layer is formed between the floating gate and a semiconductor substrate. A dielectric layer is formed between the floating gate and the control gate. The tunnel insulating layer functions to prevent charges, stored in the floating gate, from being drained. The dielectric layer functions to prohibit the transfer of charges between the floating gate and the control gate. A "program storage" operation of the flash memory device, based on the above principle, is described below.

In a memory cell string, the control gate is used as a word line. The word line is commonly connected to a plurality of memory cells constituting a plurality of memory cell strings. A voltage is transferred through the word line. If a voltage is applied to the word line, electrons within the control gate are rearranged, and a channel is formed in an active region under the tunnel insulating layer. This results in a tunneling phenomenon wherein electrons pass through the boundary of the tunnel insulating layer so that the electrons are stored in the floating gate.

The floating gate is separated by an isolation structure per cell basis. The dielectric layer and the word line are formed over the isolation structure. In this structure, if a high voltage is applied between the word line and the active region for the program operation, not only F-N (Fowle-Nordheim) tunneling occurs between the floating gate and the active region, but also unwanted current is generated between the word line and the active region. This results in a charge trap phenomenon wherein charges are trapped at layers constituting the dielectric layer, especially, the nitride layer. This causes to increase a change of the threshold voltage and degrade reliability of the device.

This phenomenon becomes more profound as the level of integration of devices increases. Accordingly, there is an urgent need for a solution for this problem.

BRIEF SUMMARY OF THE INVENTION

The present invention is directed towards a method of fabricating a flash memory device. The method can prevent a phenomenon in which charges are stored in unnecessary regions of the device, by removing all or part of a dielectric layer formed over an isolation structure. The method can prevent inter-cell interference at the time of program and erase operations, and can prohibit a change of the threshold voltage. The method can also reduce inter-bit line interference, by forming a conductive layer for a word line in a space formed by the removal of the nitride layer.

In one embodiment, the method includes providing a semiconductor substrate that includes an active region and a field region, wherein a isolation structure is formed in the field region. The method also includes forming a tunnel insulating layer and a first conductive layer over the semiconductor substrate of the active region and the field region, forming a dielectric layer over the first conductive layer, forming a capping layer over the dielectric layer, and forming a hard mask layer over the capping layer. The method also includes etching the capping layer and the dielectric layer over the isolation structure to form a hole. Furthermore, the method includes removing the hard mask. Still further, the method includes forming a second conductive layer over a structure in which the hole is formed.

DESCRIPTION OF SPECIFIC EMBODIMENTS

Now, specific embodiments according to the present patent will be described with reference to the accompanying drawings.

FIGS. 1A to 1G are cross-sectional views illustrating a method of fabricating a flash memory device according to an embodiment of the present invention.

Figure 1A:
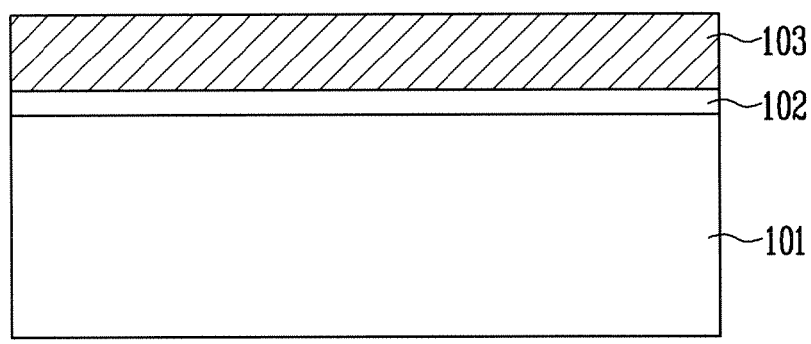
FIGS. 1A to 1G are cross-sectional views illustrating a method of fabricating a flash memory device according to an embodiment of the present invention.

Referring to FIG. 1A, a tunnel insulating layer 102 and a first conductive layer 103 are formed over a semiconductor substrate 101.

Figure 1B:
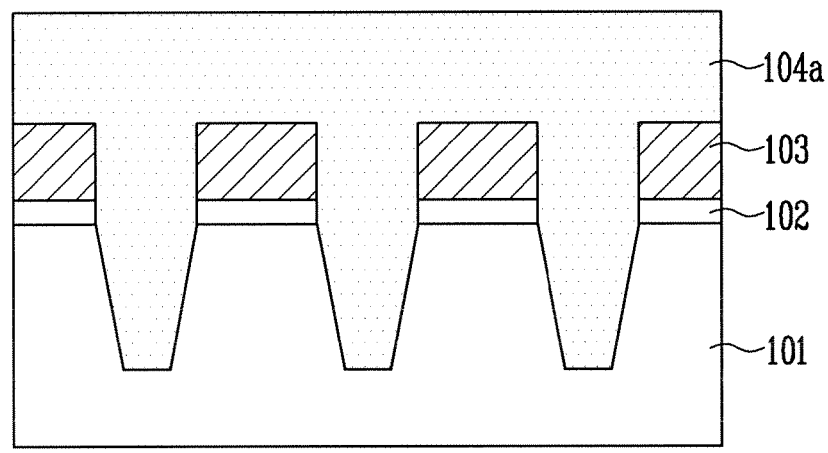

Referring to FIG. 1B, a portion of the first conductive layer 103 and the tunnel insulating layer 102 is patterned and a portion of the semiconductor substrate 101 is removed, forming trenches for element isolation. The trenches are filled with an insulating layer 104a.

Figure 1C:
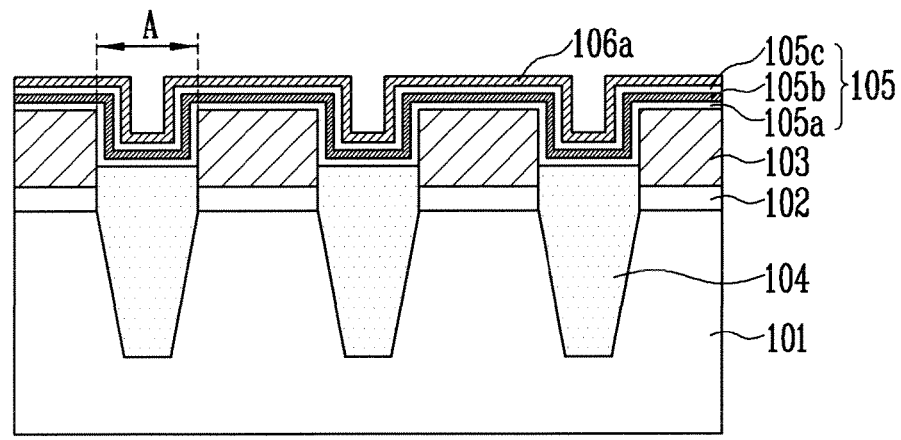

Referring to FIG. 1C, the insulating layer 104a of a specific thickness is etched by an etch process, to form an isolation structure 104, comprised of the insulating layer 104a, within the trenches. The height of the isolation structure 104 may be greater than that of the tunnel insulating layer 102, but less than that of the patterned first conductive layer 103. The isolation structure is formed in a field region, and the patterned first conductive layer 103 is formed in an active region. A dielectric layer 105 is formed along the surface of the isolation structure 104 and the first conductive layer 103. The dielectric layer 105 may have a stack structure of a first oxide layer 105a, a nitride layer 105b, and a second oxide layer 105c. The dielectric layer 105 functions to prohibit the flow of charges between a floating gate and a control gate. A capping layer 106a is formed along the surface of the dielectric layer 105. The capping layer 106a may include polysilicon, and functions to protect the dielectric layer 105. The capping layer 106a may have a thickness of 10 angstroms or greater, and may have a thickness, which is less than ¼ (25%) of a cell pitch A.

Figure 1D:
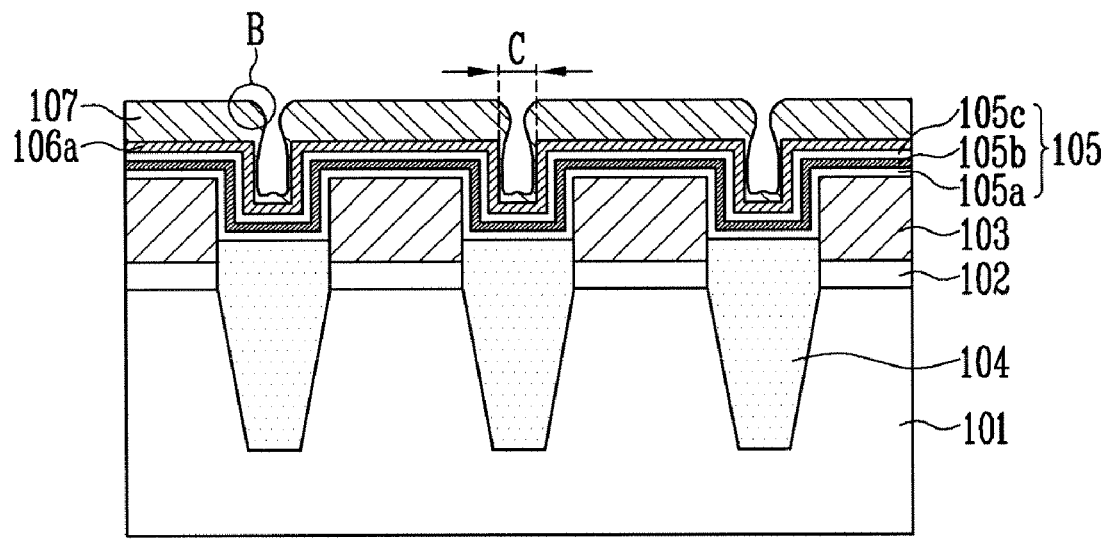

Referring to FIG. 1D, a hard mask layer 107 for an etch mask is formed over the capping layer 106a. The hard mask layer 107 may include any one of $Si_3N_4$, TiN, $SiO_2$, polysilicon, and amorphous carbon to obtain a single-layer structure, or may include two or more of $Si_3N_4$, TiN, $SiO_2$, polysilicon, and amorphous carbon to obtain a stack structure. The hard mask layer 107 may be formed by performing at least one of a plasma enhanced chemical vapor deposition (PE-CVD) method, a photo voltage decay (PVD) method, a chemical vapor deposition (CVD), method and a low pressure chemical vapor deposition (LP-CVD). The method of forming the hard mask film 107 is described below in detail.

First, the hard mask layer 107 may be formed by depositing $Si_3N_4$ by performing a PE-CVD method. Second, the hard mask layer 107 may be formed by depositing $Si_3N_4$ by performing a PVD method. Third, the hard mask layer 107 may be formed by depositing TiN by performing a PVD method. Fourth, the hard mask layer 107 may be formed by depositing TiN by performing a PVD method, and subsequently depositing $Si_3N_4$ thereon by performing a PE-CVD method, or may be formed by depositing $Si_3N_4$ and subsequently depositing TiN. Fifth, the hard mask layer 107 may be formed by depositing TiN by performing a PVD method and subsequently depositing $SiO_2$ thereon by performing a PE-CVD method, or may be formed by depositing $SiO_2$ and subsequently depositing TiN thereon. Sixth, the hard mask layer 107 may be formed by depositing polysilicon by performing a PVD or PE-CVD method. Seventh, the hard mask layer 107 may be formed by depositing polysilicon by performing a LP-CVD method and subsequently depositing polysilicon thereon by performing a PVD method or a PE-CVD method, or may be formed by depositing polysilicon by performing a PVD method or a PE-CVD method and subsequently depositing polysilicon thereon by performing a LP-CVD method.

If the hard mask layer 107 is formed by performing the sixth or seventh methods, the process of forming the capping layer 106a may be omitted. This is because the hard mask layer 107 can serve as not only the capping layer 106a, but also as an etch mask.

In the hard mask layer 107 formed by the foregoing methods, a thickness of the hard mask layer 107 formed on the surface of a concave portion is thinner than that of the hard mask layer 107 formed on the surface of a convex portion. This is because overhang B is generated at the edge of the hard mask layer 107 and a material for a hard mask is rarely deposited on the surface of the concave portion. The hard mask layer 107 should be formed by controlling the thickness in consideration of the overhang (B) such that an inter-cell space C is not clogged.

Figure 1E:
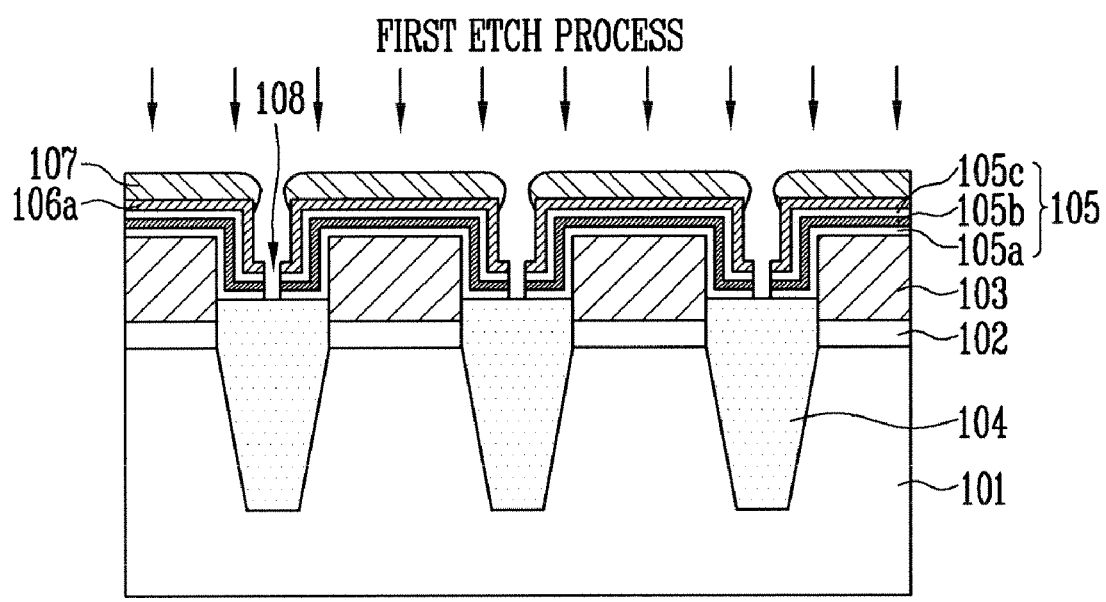

Referring to FIG. 1E, the capping layer 106a and the dielectric layer 105 over the isolation structure 104 are etched by performing a first etch process using the hard mask layer 107 as an etch mask, forming holes 108. The first etch process may be performed by using a blanket etch process. During the first etch process, the concave portion that is relatively thin (i.e., the hard mask layer 107 of a portion formed by the first conductive layer 103 and the isolation structure 104) is first removed while the hard mask layer 107 is removed to a certain thickness, so that the capping layer 106a is exposed and the holes 108 are then formed.

The hole 108 may be formed by using one of three methods so that the nitride layer 105b is exposed. First, the hole 108 may be formed by performing the first etch process to remove the capping layer 106a and the second oxide layer 105c. Second, the hole 108 may be formed by performing the first etch process to remove the capping layer 106a, the second oxide layer 105c, and the nitride layer 105b. Third, as shown in FIG. 1E, the hole 108 may be formed by performing the first etch process to remove the capping layer 106a, the second oxide layer 105c, the nitride layer 105b, and the first oxide layer 105a.

Figure 1F:
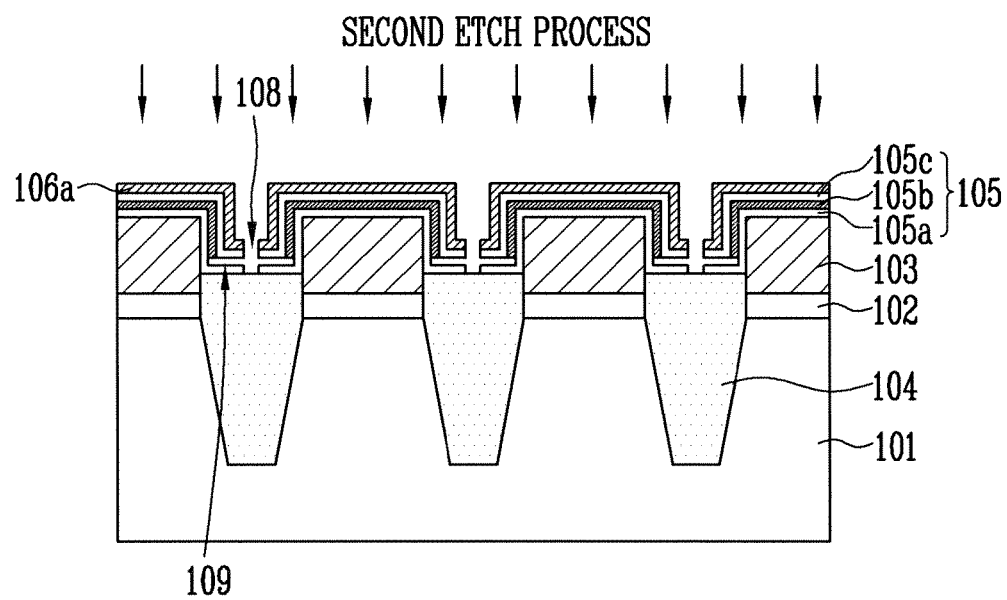

Referring to FIG. 1F, the hard mask layer 107 is all removed by performing a second etch process, and an undercut 109 is formed in the dielectric layer 105. The undercut 109 is formed between the first oxide layer 105a and the second oxide layer 105c as the nitride layer 105b is removed to a certain depth.

The second etch process may be performed by using one of three methods depending on a material forming the hard mask layer 107. First, in the event that the hard mask layer 107 is formed of a nitride such as $Si_3N_4$ or TiN, the undercut 109 may be formed by once performing a wet etch process employing a nitride etchant to partially remove the nitride layer 105b while removing the hard mask layer 107. Second, in the event that the hard mask layer 107 is formed of material other than nitride, such as $SiO_2$, polysilicon or amorphous carbon, a portion of the nitride layer 105b may be removed by performing a wet etch process employing a nitride etchant, thus forming the undercut 109, and the hard mask layer 107 is then removed by performing a wet etch process with an etchant of other material. Third, in the event that the hard mask layer 107 is formed of material other than nitride, such as $SiO_2$, polysilicon or amorphous carbon, the undercut 109 may be formed by performing a wet etch process with an etchant of other material to remove the hard mask layer 107, and subsequently partially with a nitride etchant to partially remove the nitride layer 105c.

Figure 1G:
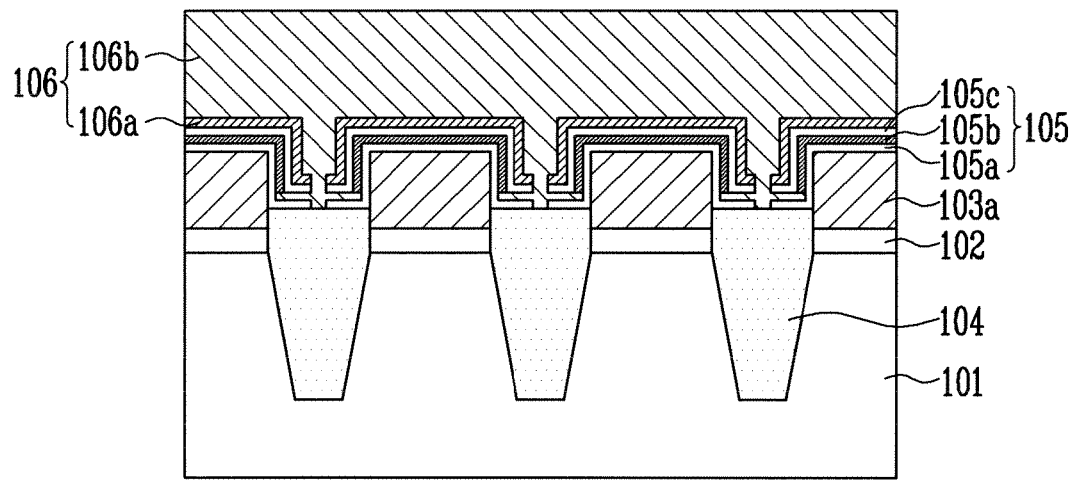

Referring to FIG. 1G, a second conductive layer 106b is formed over a structure in which the holes 108 and the undercut 109 are formed. The second conductive layer 106b may have a stack structure of a polysilicon layer and a silicide layer. The second conductive layer 106b, the capping layer 106a, the dielectric layer 105, and the first conductive layer 103 are then patterned by performing an etch process with a word line mask. A flash memory cell in which the tunnel insulating layer 102, the floating gate 103a, the dielectric layer 105, and the control gate 106 are stacked is thereby completed.

As described above, because the nitride layer 105b over the isolation structure 104 is removed, a phenomenon in which charges are trapped at the nitride layer 105b can be decreased. Accordingly, a change of an inter-cell threshold voltage can be reduced.

As described above, according to the present invention, because the nitride layer over the isolation structure is removed, a phenomenon in which charges are trapped at unnecessary regions can be prevented. Accordingly, at the time of a "program" or "erase" operation of a device, inter-cell interference can be reduced, a change of the threshold voltage can be prevented, and reliability of the device can be improved.

Although the foregoing description has been made with reference to the specific embodiments, it is to be understood that changes and modifications of the present patent may be made by the ordinary skilled in the art without departing from the spirit and scope of the foregoing disclosure, the drawings, and the appended claims.

What is claimed is:

1. A method of fabricating a flash memory device, the method comprising:
   providing a semiconductor substrate comprising an active region and a field region wherein a isolation structure is formed in the field region;
   forming a tunnel insulating layer and a first conductive layer over the semiconductor substrate;
   forming a dielectric layer over the first conductive layer;
   forming a capping layer over the dielectric layer;
   forming a hard mask layer over the capping layer;
   etching the hard mask layer, the capping layer, and the dielectric layer over the isolation structure to form a hole;

removing the hard mask layer; and forming a second conductive layer over the capping layer in which the hole is formed.

2. The method of claim 1, wherein the isolation structure has a height greater than that of the tunnel insulating layer, but less than that of the first conductive layer.

3. The method of claim 1, wherein the capping layer comprises polysilicon.

4. The method of claim 1, wherein the hard mask layer is a single layer structure comprising any one of $Si_3N_4$, TiN, $SiO_2$, polysilicon, and amorphous carbon, or a stack structure comprising two or more of $Si_3N_4$, TiN, $SiO_2$, polysilicon, and amorphous carbon.

5. The method of claim 1, wherein forming the hard mask layer comprises performing at least one of a PE-CVD method, a PVD method, a CVD method, and a LP-CVD method.

6. The method of claim 1, wherein forming the hard mask layer comprises depositing $Si_3N_4$ by performing a PE-CVD method or a PVD method.

7. The method of claim 1, wherein forming the hard mask layer comprises depositing TiN by performing a PVD method.

8. The method of claim 1, wherein forming the hard mask layer comprises depositing TiN by performing a PVD method and subsequently depositing $Si_3N_4$ on the TiN by performing a PE-CVD method, or by depositing $Si_3N_4$ and subsequently depositing TiN on the $Si_3N_4$.

9. The method of claim 1, wherein forming the hard mask layer comprises depositing TiN by performing a PVD method and subsequently depositing $SiO_2$ on the TiN by performing a PE-CVD method, or by depositing $SiO_2$ and subsequently depositing TiN on the $SiO_2$.

10. The method of claim 1, wherein forming the hard mask layer comprises depositing polysilicon by performing a PVD or PE-CVD method, or depositing polysilicon by performing a LP-CVD method and subsequently depositing polysilicon by performing a PVD method or a PE-CVD method, or depositing polysilicon by performing a PVD method or a PE-CVD method and depositing polysilicon by performing a LP-CVD method.

11. The method of claim 1, wherein the hard mask layer has an overhang formed at its edge.

12. The method of claim 1, wherein the dielectric layer has a stack structure of a first oxide layer, a nitride layer, and a second oxide layer, and performing the first etch process comprises removing the capping layer, the second oxide layer and, optionally, one or more of the nitride layer and the first oxide layer to form the holes.

13. The method of claim 1, wherein:

the dielectric layer has a stack structure of a first oxide layer, a nitride layer, and a second oxide layer, and the hard mask layer is formed of a nitride, and, the method comprises removing a portion of the nitride layer while removing the hard mask layer, to form a undercut.

14. The method of claim 1, wherein:

the dielectric layer has a stack structure of a first oxide layer, a nitride layer, and a second oxide layer, and the hard mask layer is formed of a material other than nitride, and, the method comprises removing a portion of the nitride layer to form a undercut, and removing the hard mask layer.

15. The method of claim 13, wherein the removing the portion of the nitride layer and the hard mask layer is performed with nitride etchant.

16. The method of claim 15, wherein the removing the portion of the nitride layer is performed with nitride etchant, and the removing the hard mask layer is performed with an etchant of other material.

17. A method of fabricating a flash memory device, the method comprising:

providing a semiconductor substrate comprising an active region and a field region, wherein a isolation structure is formed in the field region;

forming a tunnel insulating layer and a first conductive layer over the semiconductor substrate;

forming a dielectric layer over the first conductive layer;

forming a hard mask layer over the dielectric layer, wherein the hard mask layer comprises polysilicon and the hard mask layer is formed by depositing polysilicon by (a) performing a PVD or PE-CVD method, (b) performing a LP-CVD method and subsequently performing a PVD or PE-CVD method, or (c) performing a PVD or PE-CVD method and subsequently performing a LP-CVD method;

performing a first etch process using the hard mask layer as an etch mask to etch the dielectric layer over the isolation structure, forming a hole;

performing a second etch process to remove the hard mask layer and to form an undercut in the dielectric layer; and, forming a second conductive layer over a structure in which the hole and undercut are formed.

* * * * *